US012793943B2

(12) United States Patent
Sowwan et al.

(10) Patent No.: US 12,793,943 B2
(45) Date of Patent: Nov. 10, 2026

(54) PLASMA GENERATOR AND INJECTOR ASSEMBLY FOR A PROCESSING CHAMBER, AND RELATED METHODS

(71) Applicant: Applied Materials, Inc., Santa Clara, CA (US)

(72) Inventors: Mukhles Sowwan, Sunnyvale, CA (US); Shu-Kwan Lau, Sunnyvale, CA (US); Abhishek Kallmakki Chandrashekar, Madurai (IN); Raja Murali Dhamodharan, Madurai (IN); Shawn Thomas, Chesterfield, MO (US); Saurabh Chopra, Santa Clara, CA (US); Ernesto J. Ulloa, San Jose, CA (US); Henry Barandica, San Jose, CA (US); Kelvin Chan, San Ramon, CA (US); Thai Cheng Chua, Cupertino, CA (US); Houshmand Farzad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/821,229

(22) Filed: Aug. 30, 2024

(65) Prior Publication Data

US 2026/0066231 A1 Mar. 5, 2026

(51) Int. Cl.
*H01J 37/32* (2006.01)

(52) U.S. Cl.
CPC .. *H01J 37/32201* (2013.01); *H01J 37/32238* (2013.01); *H01J 37/3244* (2013.01); *H01J 37/32559* (2013.01); *H01J 37/32633* (2013.01)

(58) Field of Classification Search
CPC ............ H01J 37/3244; H01J 37/32201; H01J 37/32238; H01J 37/32559; H01J 37/32633
See application file for complete search history.

(56) References Cited

U.S. PATENT DOCUMENTS 11,081,317 B2 8/2021 Chua et al.
11,393,661 B2 7/2022 Nguyen et al.
(Continued)

FOREIGN PATENT DOCUMENTS

KR 2019-0025365 A 3/2019
WO 2022-125912 A1 6/2022
WO 2024064161 A1 3/2024

OTHER PUBLICATIONS

International Search Report and Written Opinion for PCT/US2025/041778 Dated Dec. 5, 2025.

*Primary Examiner* — Renan Luque
(74) *Attorney, Agent, or Firm* — Patterson + Sheridan, LLP

(57) ABSTRACT

Embodiments of the present disclosure generally relate to plasma generator and injector assembly for use in a processing chamber. In one or more embodiments, a substrate processing chamber includes a chamber body at least partially defining an internal volume. The processing chamber further includes a plasma generator including a first housing to deliver a generation power and a second housing coupled to the first housing to at least partially define a plasma volume between the second housing and the first housing. A gas inlet extends through the second housing to the plasma volume. The gas inlet is configured to be fluidly coupled to a gas source. An injector is fluidly connected to the plasma generator. The injector includes one or more openings arranged in one or more channels. A mount arm includes a first end section coupled to the injector and a second end section coupled to the second housing.

18 Claims, 8 Drawing Sheets

(56) References Cited

U.S. PATENT DOCUMENTS

| | | | |
|---|---|---|---|
| 11,404,248 | B2 | 8/2022 | Kraus et al. |
| 11,670,489 | B2 | 6/2023 | AuBuchon et al. |
| 12,002,654 | B2 | 6/2024 | Chua et al. |
| 2010/0037824 | A1 | 2/2010 | Lee |
| 2013/0276983 | A1 | 10/2013 | Park et al. |
| 2019/0062904 | A1* | 2/2019 | Hawrylchak ....... C23C 16/0227 |
| 2020/0047222 | A1* | 2/2020 | Won ...................... B08B 7/0035 |
| 2020/0066495 | A1* | 2/2020 | Noorbakhsh ..... H01J 37/32082 |
| 2020/0273678 | A1 | 8/2020 | Funk et al. |
| 2022/0319812 | A1 | 10/2022 | Nguyen et al. |
| 2022/0344131 | A1 | 10/2022 | Kraus et al. |

* cited by examiner

PLASMA GENERATOR AND INJECTOR ASSEMBLY FOR A PROCESSING CHAMBER, AND RELATED METHODS

BACKGROUND

Field

Embodiments of the present disclosure generally relate to an injector assembly for use in a processing chamber, and related components and methods.

Description of the Related Art

Semiconductor substrates are processed for a wide variety of applications, including the fabrication of integrated devices and microdevices. During processing, various parameters can affect the uniformity of material deposited on the substrate. For example the material can be deposited on other components besides the substrate, which can hinder deposition uniformity and deposition efficacy. Moreover, selective processing can be difficult. Additionally, it can be difficult to use relatively low substrate temperatures for processing operations.

Therefore, a need exists for improved chamber components that selectively deposit and/or etch material on the substrate.

SUMMARY

Embodiments of the present disclosure generally relate to plasma generator and injector assembly for use in a processing chamber, and related components and methods.

In one or more embodiments, a substrate processing chamber includes a chamber body at least partially defining an internal volume. The processing chamber further includes a plasma generator including a first housing to deliver a generation power and a second housing coupled to the first housing to at least partially define a plasma volume between the second housing and the first housing. A gas inlet extends through the second housing to the plasma volume. The gas inlet is configured to be fluidly coupled to a gas source. An injector is fluidly connected to the plasma generator. The injector includes one or more openings arranged in one or more channels. A mount arm includes a first end section coupled to the injector and a second end section coupled to the second housing.

In one or more embodiments, an injector assembly includes a plasma generator including a first housing to deliver a generation power and a second housing coupled to the first housing to at least partially define a plasma volume between the second housing and the first housing. A gas inlet extends through the second housing to the plasma volume. The gas inlet is configured to be fluidly coupled to a gas source. A mount arm includes a first end section to couple to the second housing and a second end section to couple to an injector.

In one or more embodiments, a method of substrate processing includes performing an ignition process including flowing a plasma gas into a plasma volume of a plasma generator and igniting the plasma gas into a plasma using electromagnetic radiation. The method further includes performing a chamber substrate process including activating a processing gas using the plasma and flowing the processing gas into an injector. The chamber substrate process further includes flowing the processing gas from the injector across the substrate in an internal volume and processing the substrate using the processing gas.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to plasma generator and injector assembly for use in a processing chamber, and related components and methods.

The disclosure contemplates that terms such as "couples," "coupling," "couple," and "coupled" may include but are not limited to bonding, embedding, welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links, blocks, and/or frames.

Figure 1:
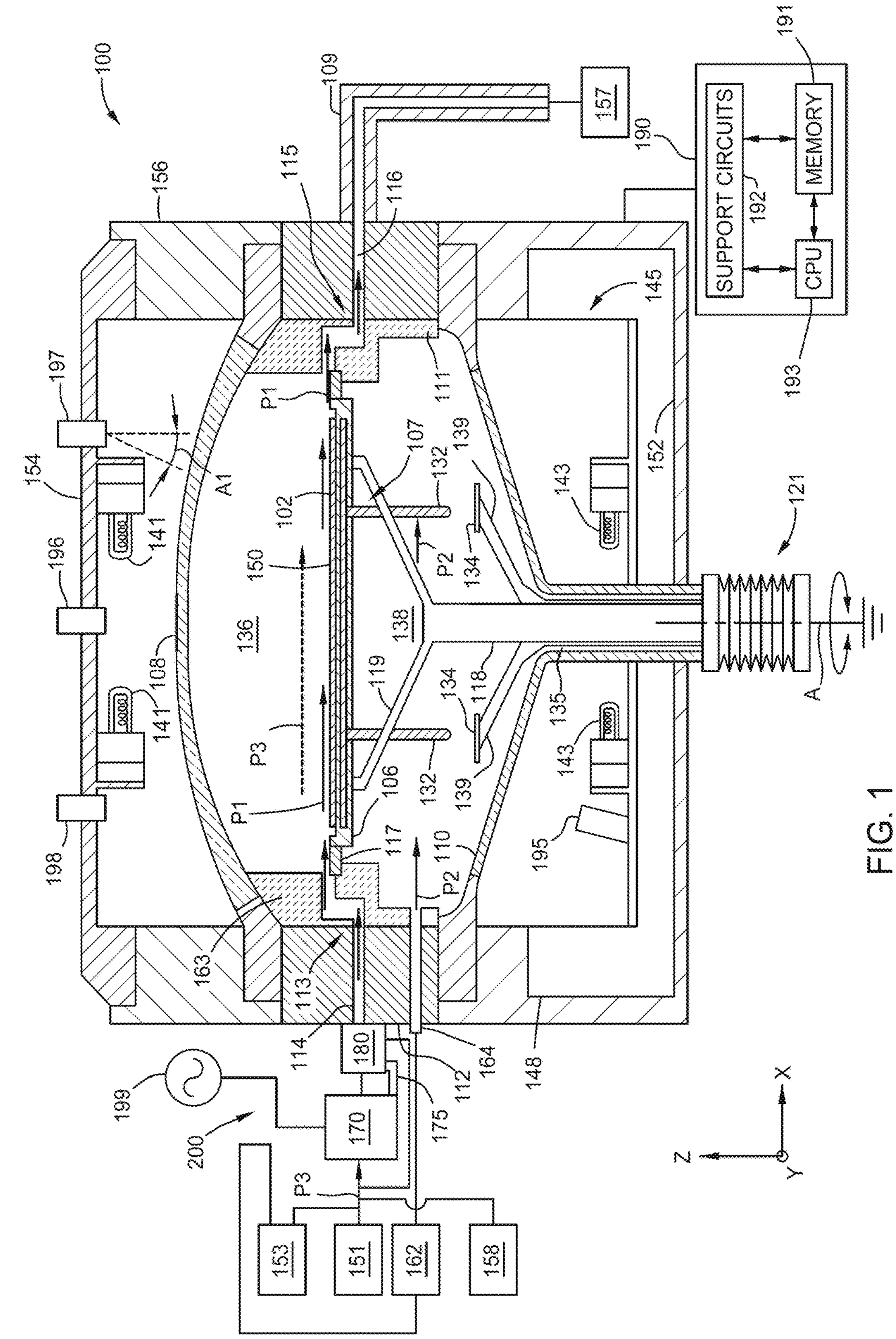
FIG. 1 is a schematic side cross-sectional view of a processing chamber, according to one or more embodiments.

FIG. 1 is a schematic side cross-sectional view of a processing chamber 100, according to one or more embodiments. The processing chamber 100 is a deposition chamber. In one or more embodiments the processing chamber 100 is applicable for semiconductor manufacturing. In one or more embodiments, the processing chamber 100 is an epitaxial deposition chamber. The processing chamber 100 is utilized to grow an epitaxial film on a substrate 102, and the processing chamber 100 is used to supply a plasma for plasma operations (such as plasma-assisted film deposition, supply of activated precursor gases into the substrate 102, pre-cleaning of the substrate 102, etching of the substrate 102, and/or cleaning of the processing chamber 100). In one or more embodiments, the processing chamber 100 creates a cross-flow of precursors across a top surface 150 of the substrate 102. The processing chamber 100 is shown in a processing condition in FIG. 1.

The processing chamber 100 includes an upper body 156, a lower body 148 disposed below the upper body 156, and a flow module 112 disposed between the upper body 156 and the lower body 148. The upper body 156, the flow module 112, and the lower body 148 form a chamber body. Disposed within the chamber body is a substrate support 106, a plate 108, one or more heat sources 141, 143, and a window 110 (e.g., a lower window, for example a lower dome). The window 110 is formed of an energy transmissive material, such as transparent quartz. In one or more embodiments, the plate 108 is a window, such as an upper window, for example an upper dome. In such an embodiment, the plate 108 can be formed of an energy transmissive material, such as transparent quartz. The one or more heat sources 141, 143 include a plurality of lower heat sources 143 operable to heat a processing volume 136 from one side of the substrate 102 (e.g., from below the substrate 102). The one or more heat sources 141, 143 are positioned to heat a substrate 102 disposed on the substrate support 106. In one or more embodiments, the one or more heat sources 141, 143 include a plurality of upper heat sources 141 operable to heat the processing volume 136 from a second side of the substrate 102 (e.g., from above the substrate 102). The chamber body and the plate 108 at least partially define the processing volume 136. In one or more embodiments, the heat sources 141, 143 include lamps (such as halogen lamps or UV lamps). The present disclosure contemplates that other heat sources may be used (in addition to or in place of the lamps) for the various heat sources described herein. For example, resistive heaters, microwave powered heaters, light emitting diodes (LEDs), lasers (e.g., laser diodes), and/or or any other suitable heat source singly or in combination may be used for the various heat sources described herein.

The substrate support 106 is disposed in the processing volume 136 and between the plate 108 and the window 110. The substrate support 106 is disposed between the one or more heat sources 141, 143, and the substrate support 106 supports the substrate 102. The plate 108 is disposed between the substrate support 106 and a lid 154 of the processing chamber 100. In one or more embodiments, the substrate support 106 includes a susceptor. Other substrate supports (including, for example, a substrate carrier and/or one or more ring segment(s) that support one or more outer regions of the substrate 102) are contemplated by the present disclosure. The upper heat sources 141 are disposed between the lid 154 and the plate 108. The plurality of lower heat sources 143 are disposed between the window 110 and a floor 152. The plurality of lower heat sources 143 form a portion of a lower heat source module 145.

The processing volume 136 and a purge volume 138 are between the plate 108 and the window 110. The processing volume 136 and the purge volume 138 are part of an internal volume of the processing chamber 100. One or more liners 111, 163 are disposed inwardly of the chamber body.

The substrate support 106 includes a top surface on which the substrate 102 is disposed. The substrate support 106 is coupled to a shaft 118. In one or more embodiments, the substrate support 106 is coupled to the shaft 118 through one or more arms 119 coupled to the shaft 118. The shaft 118 is coupled to a motion assembly 121. The motion assembly 121 includes one or more actuators and/or adjustment devices that provide movement and/or adjustment for the shaft 118 and/or the substrate support 106 within the processing volume 136.

The substrate support 106 may include lift pin holes 107 disposed therein. The lift pin holes 107 are each sized to accommodate a lift pin 132 for lifting of the substrate 102 from the substrate support 106 before or after a deposition process is performed. The lift pins 132 may rest on lift pin stops 134 when the substrate support 106 is lowered from a process position to a transfer position. The lift pin stops 134 can include a plurality of arms 139 that attach to a shaft 135.

The flow module 112 includes one or more gas inlets 114 (e.g., a plurality of gas inlets), one or more purge gas inlets 164 (e.g., a plurality of purge gas inlets), and one or more gas exhaust outlets 116. The one or more gas inlets 114 are part of an inject portion 113 of the chamber body, and the one or more gas exhaust outlets 116 are part of an exhaust portion 115 of the chamber body. The one or more gas inlets 114 and the one or more purge gas inlets 164 are disposed on the opposite side of the flow module 112 from the one or more gas exhaust outlets 116. A pre-heat ring 117 is disposed below the one or more gas inlets 114 and the one or more gas exhaust outlets 116. The pre-heat ring 117 is disposed above the one or more purge gas inlets 164. The pre-heat ring 117 can include a complete ring or one or more ring segments. The one or more liners 111, 163 are disposed on an inner surface of the flow module 112 and protects the flow module 112 from reactive gases used during a deposition process and/or cleaning process. The gas inlets 114 and the purge gas inlets 164 are each positioned to flow a respective one or more process gases P1 and one or more purge gases P2 parallel to the top surface 150 of a substrate 102 disposed within the processing volume 136. The gas inlets 114 are fluidly connected an injector 180. The injector 180 is fluidly connected to one or more process gas sources 151 and one or more cleaning gas sources 153. The purge gas inlets 164 are fluidly connected to one or more purge gas sources 162. The one or more gas exhaust outlets 116 are fluidly connected to an exhaust pump 157. In one or more embodiments the one or more process gases P1 include a deposition gas. The one or more process gases P1 supplied using the one or more process gas sources 151 can include one or more reactive gases (such as one or more of silicon (Si), phosphorus (P), and/or germanium (Ge)) and/or one or more carrier gases (such as one or more of hydrogen ($H_2$) and Argon). The one or more purge gases P2 supplied using the one or more purge gas sources 162 can include one or more inert gases (such as one or more of argon (Ar), helium (He), and/or nitrogen ($N_2$)). One or more cleaning gases supplied using the one or more cleaning gas sources 153 can include one or more of hydrogen (H) and/or chlorine (Cl). In one or more embodiments, the one or more process gases P1 include silicon phosphide (SiP) and/or phosphine ($PH_3$), and the one or more cleaning gases include hydrochloric acid (HCl).

One or more plasma gas sources 158 are also fluidly connected to the gas inlets 114. The one or more plasma gas sources 158 supply one or more plasma precursor gases that can be ignited into a plasma. A plasma generator 170 is disposed at least partially outwardly of the flow module 112. The plasma generator 170 is electrically coupled to a plasma power source 199. The plasma power source 199 includes an electromagnetic power source, such as a microwave power source. The plasma generator 170 is described in greater detail in FIGS. 2A and 2B. During a deposition process, a plasma gas P3 flows from the plasma gas source 158 and through the plasma generator 170, and the plasma generator 170 ignites the plasma gas P3 into a plasma PS1 which then flows into an injector 180. The injector 180 is fluidly coupled to the plasma generator 170 downstream from the plasma generator 170. The injector 180 and the plasma generator 170 at least part of an injector assembly 200. The injector 180 is described in greater detail in FIGS. 2 and 3. Furthermore, the injector 180 is fluidly coupled to the one or more process gas sources 151, the one or more cleaning gas sources 153, the one or more purge gas sources 162, and/or the one or more plasma gas sources. The injector 180 is fluidly coupled to the gas inlets 114, upstream from the gas inlets 114. During a deposition process, plasma PS1 can be mixed with other gases, such as the processing gas P1, in the plasma generator 170. The plasma gases P3 and the processing gas P1 then flows into the gas inlets 114. The plasma gas PS1 can activate the processing gas P1 in the plasma generator 170, and/or the plasma gases P3 can activate the processing gas P1 downstream of the plasma generator 170. The one or more plasma gases P3 supplied using the one or more plasma gas sources 158 can include one or more plasma precursor gases to generate plasma. The one or more plasma precursor gases can include for example Argon (Ar), Xenon ($Xe_2$), Neon ($Ne_2$), Helium ($He_2$) Fluorine ($F_2$), Krypton (Kr2), hydrogen, and/or any mixtures thereof (such as Krypton Fluoride (KrF). In one or more embodiments, the plasma gas P3 can be mixed in the plasma generator (or downstream in the injector after the plasma gas P3 flow out of the plasma generator) with one or more silicon-containing gases (e.g., silane, dichlorosilane (DCS), trichlorosilane (TCS), disilane (DS), and/or tetraclorosilane) mixed with a carrier gas (e.g., argon, hydrogen, and/or helium). In one or more embodiments, the plasma gas P3 can be mixed inside the plasma generator (or downstream in the injector after the plasma gas P3 flow out of the plasma generator) with one or more dopant gases, such as germane, diborane, and/or phosphorous. Other gases are contemplated for the plasma gas P3. Other plasma precursor gases are contemplated to generate the plasma. The injector 180 is mounted to the flow module 112. The plasma generator 170 is mounted (such as directly mounted) to the injector using a mount arm 175. In one or more embodiments, the mount arm 175 is a bracket, such as a Z-shaped bracket. Other mount arms are contemplated.

The one or more gas exhaust outlets 116 are further connected to or include an exhaust system 109. The exhaust system 109 fluidly connects the one or more gas exhaust outlets 116 and the exhaust pump 157. The exhaust system 109 can assist in the controlled deposition of a layer on the substrate 102. The exhaust system 109 is disposed on an opposite side of the processing chamber 100 relative to the flow module 112.

The processing chamber 100 includes the one or more liners 111, 163 (e.g., a lower liner 111 and an upper liner 163). The flow module 112 (which can be at least part of a sidewall of the processing chamber 100) includes the one or more gas inlets 114 in fluid communication with the processing volume 136. The one or more gas inlets 114 are in fluid communication with one or more flow gaps between the upper liner 163 and a lower liner 111.

During a deposition operation (e.g., an epitaxial growth operation), the one or more process gases P1 flow through the one or more gas inlets 114 and into the processing volume 136 to flow over the substrate 102.

The present disclosure also contemplates that the one or more purge gases P2 can be supplied to the purge volume 138 (e.g., through the one or more purge gas inlets 164) during the deposition operation, and exhausted from the purge volume 138. The one or more purge gases P2 flow simultaneously with the flowing of the one or more process gases P1. The one or more process gases P1 are exhausted through gaps between the upper liner 163 and the lower liner 111, and through the one or more gas exhaust outlets 116. The one or more purge gases P2 can be exhausted through one or more outlet openings, and through the same one or more gas exhaust outlets 116 as the one or more process gases P1. The present disclosure contemplates that that the one or more purge gases P2 can be separately exhausted through one or more second gas exhaust outlets that are separate from the one or more gas exhaust outlets 116.

During a cleaning operation, one or more cleaning gases flow through the one or more gas inlets 114, through the one or more gaps (between the upper liner 163 and the lower liner 111), and into the processing volume 136.

The present disclosure contemplates that the plasma gas P3 and the one or more process gases P1 can be applied simultaneously and/or sequentially with respect to each other. In one or more embodiments, during the cleaning operation the plasma gas P3 is flowed through the injector 180 simultaneously with the process gases P1 (the plasma gas P3 can be flowed with the process gases P1 or separately from the process gases P1), or before or after the flowing of the one or more process gases P1. The plasma gas P3 may flow into the processing volume 136 before the processing gas P1 to pre clean the substrate 102. The plasma may flow into the processing volume 136 after the process gases P1 in order to clean the processing volume 136 after deposition operations. In one or more embodiments, the plasma gas P3 flows simultaneously with the process gases P1 through the injector 180. The plasma gas P3 and the process gases P1 may flow into the processing volume 136 simultaneously where the plasma PS1 may assist in the deposition operation by facilitating activation of the process gas(es) P1 (e.g., by breaking bonds of the process gas(es) P1.

The processing chamber 100 includes one or more sensor devices 195, 196, 197, 198 (e.g., metrology sensors, and/or temperature sensors) configured to measure parameter(s) (e.g., temperature(s)) within the processing chamber 100 and/or metrology parameter(s) of the substrate 102). In one or more embodiments, the one or more sensor devices 195, 196, 197, 198 include a central sensor device 196 and one or more outer sensor devices 195, 197, 198. A controller 190 (described below) can control the one or more sensor devices 195, 196, 197, 198, and can conduct method(s) analyzing uniformity of substrate processing using at least one of the one or more sensor devices 195, 196, 197, 198. In one or more embodiments, the one or more sensor devices 195, 196, 197, 198 each include a sensor that includes one or more of silicon (Si), carbon (C), gallium (Ga), and/or nitrogen (N). In one or more embodiments, the one or more sensor devices 195, 196, 197, 198 each include a silicon sensor, a silicon carbide (SiC) sensor, and/or a gallium nitride (GaN) sensor. In one or more embodiments, one or more of the sensor devices 195, 196, 197, 198 is a pyrometer and/or optical sensor, such as an optical pyrometer. The present disclosure contemplates that sensor devices other than pyrometers may be used, and/or one or more of the sensor devices 195, 196, 197, 198 can measure properties (such as metrology properties) other than temperature. For example, one or more of the sensor devices 195, 196, 197, 198 can measure one or more gas parameters and/or one or more plasma parameters (such as ion density, electron temperature, electron density, ion energy and angle distribution, enthalpy, radical density, and/or absorption). In one or more embodiments, one or more of the sensor devices 195, 196, 197, 198 include a residual gas analyzer, an optical emission spectrometer, an enthalpy probe, a Langmuir probe, Faraday cup, and/or an absorption spectrometer.

In one or more embodiments, the one or more sensor devices 195, 196, 197, 198 include one or more upper sensor devices 196, 197, 198 disposed above the substrate 102 and adjacent the lid 154, and one or more lower sensor devices 195 disposed below the substrate 102 and adjacent the floor 152. The present disclosure contemplates that at least one of the one or more lower sensor devices 195 can be vertically aligned below at least one of the upper sensor devices 196, 196, 197 (such as outer sensor device 197).

The present disclosure contemplates that all sensor devices can be disposed above the plate 108 and/or on or adjacent to the lid 154. For example, the one or more lower sensor devices 195 can be omitted.

As shown, a controller 190 is in communication with the processing chamber 100 and is used to control processes and methods, such as the operations of the methods described herein. The controller 190 is configured to receive data or input as sensor readings from sensor(s) (such as one or more of the sensor devices 195, 196, 197, 198). The sensor devices can include, for example: sensor devices that monitor growth of layer(s) on the substrate 102; and/or sensor devices that monitor temperatures of the substrate 102, the pre-heat ring 117, the substrate support 106, and/or the liners 111, 163.

The controller 190 includes a central processing unit (CPU) 193 (e.g., a processor), a memory 191 containing instructions, and support circuits 192 for the CPU 193. The controller 190 controls various items directly, or via other computers and/or controllers. In one or more embodiments, the controller 190 is communicatively coupled to dedicated controllers, and the controller 190 functions as a central controller.

The controller 190 is of any form of a general-purpose computer processor that is used in an industrial setting for controlling various substrate processing chambers and equipment, and sub-processors thereon or therein. The memory 191, or non-transitory computer readable medium, is one or more of a readily available memory such as random access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)), read only memory (ROM), floppy disk, hard disk, flash drive, or any other form of digital storage, local or remote. The support circuits 192 of the controller 190 are coupled to the CPU 193 for supporting the CPU 193. The support circuits 192 include cache, power supplies, clock circuits, input/output circuitry and subsystems, and the like. Operational parameters (e.g., a power supplied to the one or more heat sources 141, 143 and/or the plasma generator 170, a cleaning recipe, and/or a processing recipe) and operations are stored in the memory 191 as a software routine that is executed or invoked to turn the controller 190 into a specific purpose controller to control the operations of the various chambers/modules described herein. The controller 190 is configured to conduct any of the operations (such as operations of the method 600) described herein. The instructions stored on the memory, when executed, cause one or more of the operations (such as operations of the method 600) described herein to be conducted in relation to the processing chamber 100. The controller 190 and the processing chamber 100 are at least part of a system for processing substrates.

The various operations described herein can be conducted automatically using the controller 190, or can be conducted automatically or manually with certain operations conducted by a user.

During processing, in one or more embodiments, the substrate 102 is heated to a target temperature of 400 degrees Celsius or higher, or 600 degrees Celsius or less. In one or more embodiments, the target temperature for the substrate 102 is within a range of 380 degrees Celsius to 600 degrees Celsius, for example 400 degrees Celsius to 500 degrees Celsius. In one or more embodiments, the target temperature for the substrate 102 is less than 500 degrees Celsius. In one or more embodiments, the target temperature for the substrate 102 is 400 degrees Celsius or less, such as less than 200 degrees Celsius (for example about 150 degrees Celsius). The plasma PS1 can be used to facilitate effective and efficient processing at lower processing temperatures (such as a target temperature of 400 degrees Celsius or less). The processing volume can be maintained at a process pressure of 100 Torr or less, such as within a range of 0.1 Torr to 10 Torr.

Figure 2A:
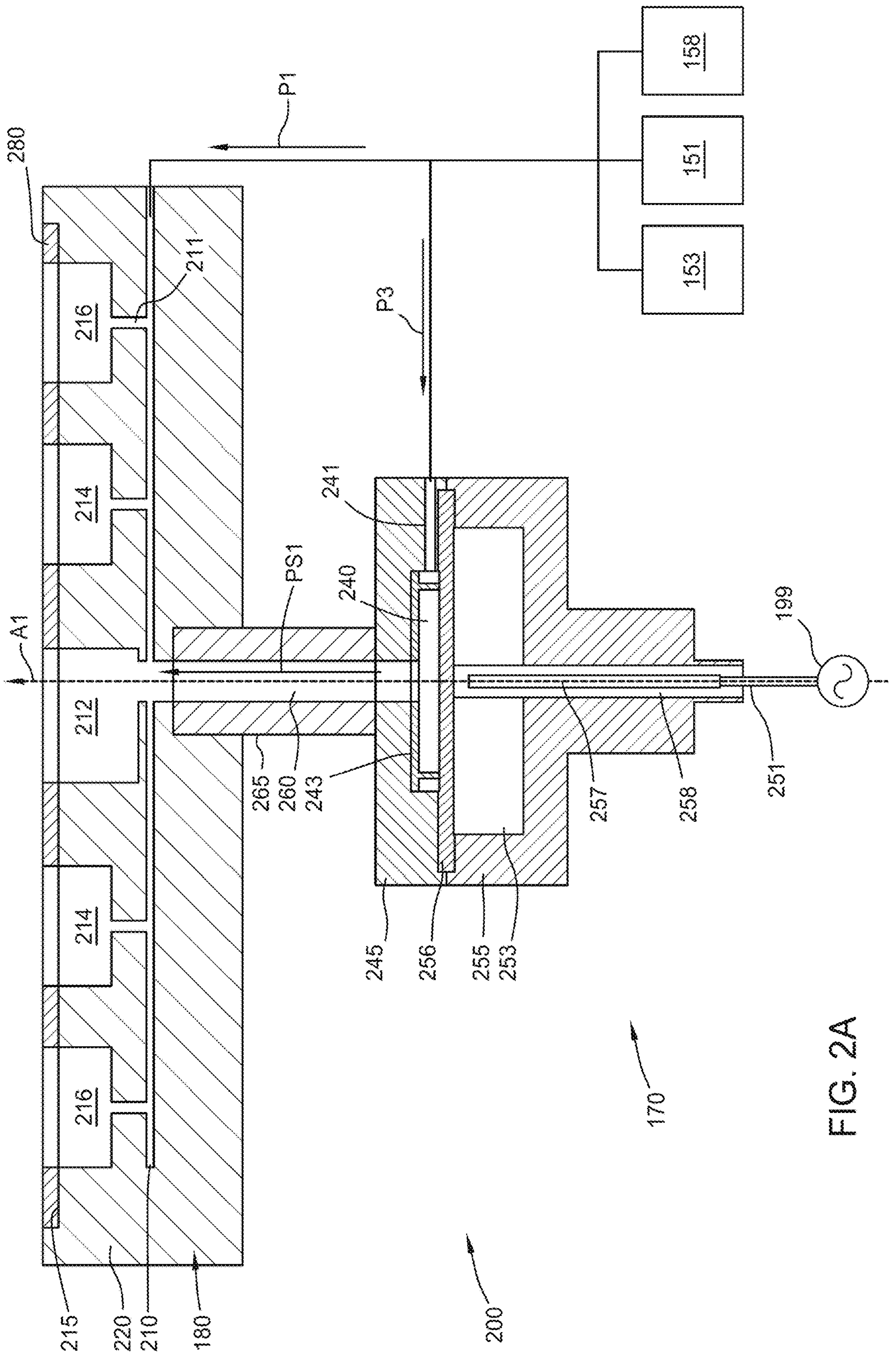
FIG. 2A is a schematic partial top cross-sectional view of the injector assembly, according to one or more embodiments.

FIG. 2A is a schematic partial top cross-sectional view of the injector assembly 200, according to one or more embodiments. The injector assembly 200 includes the plasma generator 170 and the injector 180.

The plasma generator 170 includes a first housing 255 to deliver a generation power, a resonant volume 253, a cable 251, a monopole 257, a channel 258, an isolation plate 256, a second housing 245, a plasma volume 240, a plasma liner 243, and a gas inlet 241. The first housing 255 can be referred to as a power housing and the second housing 245 can be referred to as a cover housing.

In one or more embodiments, the cable 251 is electrically coupled to the plasma power source 199. The cable is electrically coupled to the monopole 257. The monopole 257 extends axially through the channel 258 formed in the first housing 255. A portion of the monopole 257 extends though the resonant volume 253. The resonant volume 253 may be formed of a dielectric material, such as quartz, aluminum oxide, and/or titanium oxide. In one or more embodiments, the resonant volume 253 omits a material, and instead is an empty volume formed within the first housing 255. The resonant volume 253 is at least partially defined by the first housing 255 and the isolation plate 256. The isolation plate 256 separates the resonant volume 253 and the plasma volume 240. In one or more embodiments, an end of the monopole 257 is disposed at a distance from the isolation plate 256 such that the monopole 257 does not contact the isolation plate 256. In one or more embodiments, the first housing 255 is formed of multiple components coupled together.

The plasma volume 240 is at least partially defined between the first housing 255 and the second housing 245. The plasma volume 240 is at least partially defined by the isolation plate 256 and the second housing 245. The gas inlet 241 extends from the plasma volume 240 and through the second housing 245. The gas inlet 241 is configured to be fluidly coupled to one or more gas sources (such as the one or more plasma gas sources 158). A plasma liner 243 is disposed within the plasma volume 240. The plasma liner 243 is discussed in greater detail in FIG. 5. The plasma liner 243 is formed of a dielectric material. In one or more embodiments, the dielectric material includes quartz. In one or more embodiments, plasma liner 243 is a removable component as described in FIG. 5. In one or more embodiments, the plasma liner 243 is a coating formed from the dielectric material applied to one or more surfaces of the second housing 245 exposed to the plasma volume. The plasma liner 243 prevents the plasma PS1 produced in the plasma volume 240 from reacting with the second housing 245, which can prevent contamination and/or erosion. A plasma channel 260 extends from the plasma volume 240 through the second housing 245 and into a plasma tube 265. The plasma tube 265 is formed from the same dielectric material as the plasma liner 243. In one or more embodiments, the cable 251, the channel 258, the monopole 257, the first housing 255, the resonant volume 253, the second housing 245, the plasma liner 243, the plasma tube 265, and the plasma channel 260 are all coaxially aligned around a center axis A1.

During an ignition process the plasma power source 199 generates electromagnetic radiation. The electromagnetic radiation is transmitted through the cable 251. The electromagnetic radiation travels along the cable 251 to the monopole 257. The electromagnetic radiation then travels along the monopole 257 and into the resonant volume 253. The resonant volume 253 is dimensioned so that the resonant volume 253 supports resonance of the electromagnetic radiation. The electromagnetic radiation creates an electromagnetic field which extends through the isolation plate 256 and into the plasma volume 240.

During the ignition process one or more gas sources 151, 153, 158 supply at least one gas. In one or more embodiments, one or more plasma gases P3 are supplied by one or more plasma gas sources 158. The one or more plasma gases P3 flow into the plasma volume 240 through the gas inlet 241. Once inside the plasma volume 240 the plasma gases P3 are ignited into a plasma PS1 by the electromagnetic field. The plasma PS1 then flows through the plasma channel 260 into the plasma tube 265. The plasma tube is fluidly coupled to the injector 180.

The injector 180 includes an inject body 220, an injector channel 210, inject channels 211, a middle channel 212, a plurality of inner channels 214, a plurality of outer channels 216, and a baffle 280. The middle channel 212 corresponds to a middle zone. The inner channels 214 correspond to an inner zone. The outer channels 216 correspond to an outer zone. The injector channel 210 extends through the inject body and is configured to fluidly connect to the one or more gas sources 151, 153, 158. The injector channel 210 fluidly connects to the plasma channel 260. The plasma channel extends through the plasma tube 265 and into the inject body 220, further extending to the middle channel 212. The inject channels 211 extend from the plurality of inner channels 214 and the plurality of outer channels 216 and fluidly connect to the injector channel 210. The middle channel 212, the plurality of inner channels 214, and the plurality of outer channels 216 are openings that extend into a front surface 215 of the inject body 220. The middle channel 212, the plurality of inner channels 214, and the plurality of outer channels 216 are fluidly connected with the inject channels 211, the injector channel 210, and the plasma channel 260. The inner channels 214 are disposed outwardly from the middle channel 212. The outer channels 216 are disposed outwardly from the inner channels 214. The baffle 280 is coupled to at least a portion of the front surface 215 and extends across the middle channel 212, the plurality of inner channels 214, and the plurality of outer channels 216. The baffle 280 is described in greater detail in FIGS. 4A and 4B. The baffle 280 is configured to be coupled to the flow module 112 in a manner that the middle channel 212, the plurality of inner channels 214, and/or the plurality of outer channels 216 are in fluid communication with the one or more gas inlets 114.

During a deposition process the one or more process gas sources 151 flow the one or more process gases P1 into the injector channel 210. The one or more process gases P1 flow through the injector channel 210 and into the middle channel 212, the plurality of inner channels 214, and the plurality of outer channels 216. The one or more process gases P1 flow from the middle channel 212, the plurality of inner channels 214, and the plurality of outer channels 216 into the one or more gas inlets 114, and continue to flow into the processing volume 136.

In one or more embodiments, the deposition process and the ignition process are performed simultaneously in a plasma assisted deposition process. During the plasma assisted deposition process the activated plasma gases P3 and/or the activated processing gases P1 flow through the plasma channel 260 into the injector 180. The activated plasma gases P3 and/or activated processing gases P1 flow from the plasma channel 260 into the middle channel 212, the plurality of inner channels 214, and the plurality of outer channels 216 through the injector channel 210 and the inject channels 211. Simultaneously and/or sequentially, the one or more process gases P1 flow from the one or more process gas sources 151 and into the middle channel 212, the plurality of inner channels 214, and the plurality of outer channels 216. The plasma gas P3 and the process gas P1 mix in into the middle channel 212, the plurality of inner channels 214, and the plurality of outer channels 216. Ions and/or radicals in the created in the plasma PS1 can activate a deposition material in the one or more process gases P1. The plasma PS1 breaks the bonds with the deposition material in the processing gases P1. This allows for the deposition material to be deposited on the substrate 102 while keeping the substrate 102 at a relatively low temperature such as a temperature under 500 degrees Celsius. The one or more process gases P1 are activated, and the one or more process gases P1 flow into the one or more gas inlets 114 and flow further into the processing volume 136. The one or more process gases P1 flow across the top surface 150 of the substrate 102 and deposits the deposition material on the substrate 102.

Figure 2B:
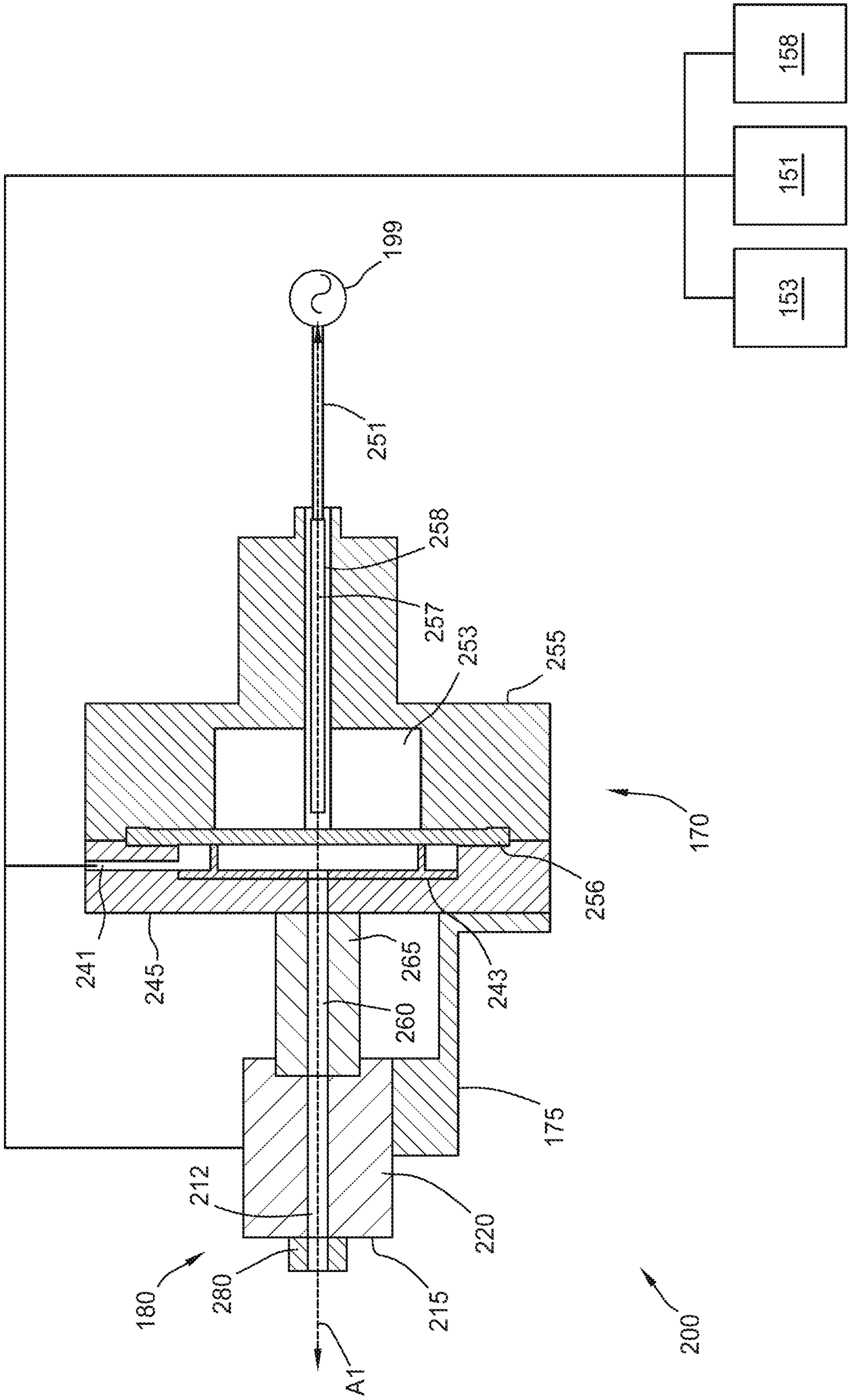
FIG. 2B a schematic partial side cross-sectional view of the injector assembly, according to one or more embodiments.

FIG. 2B is a schematic partial side cross-sectional view of the injector assembly 200, according to one or more embodiments.

In one or more embodiments, the injector 180 and the plasma generator 170 are coupled to one another using the mount arm 175. For example, the mount arm 175 mounts the plasma generator 170 to the injector 180. A first end section of the mount arm 175 is coupled to the inject body 220 and a second end section of the mount arm 175 is coupled to the second housing 245. The mount arm at least partially supports the plasma generator 170. The front surface 215 of the injector 180 is coupled to the flow module 112.

Figure 2C:
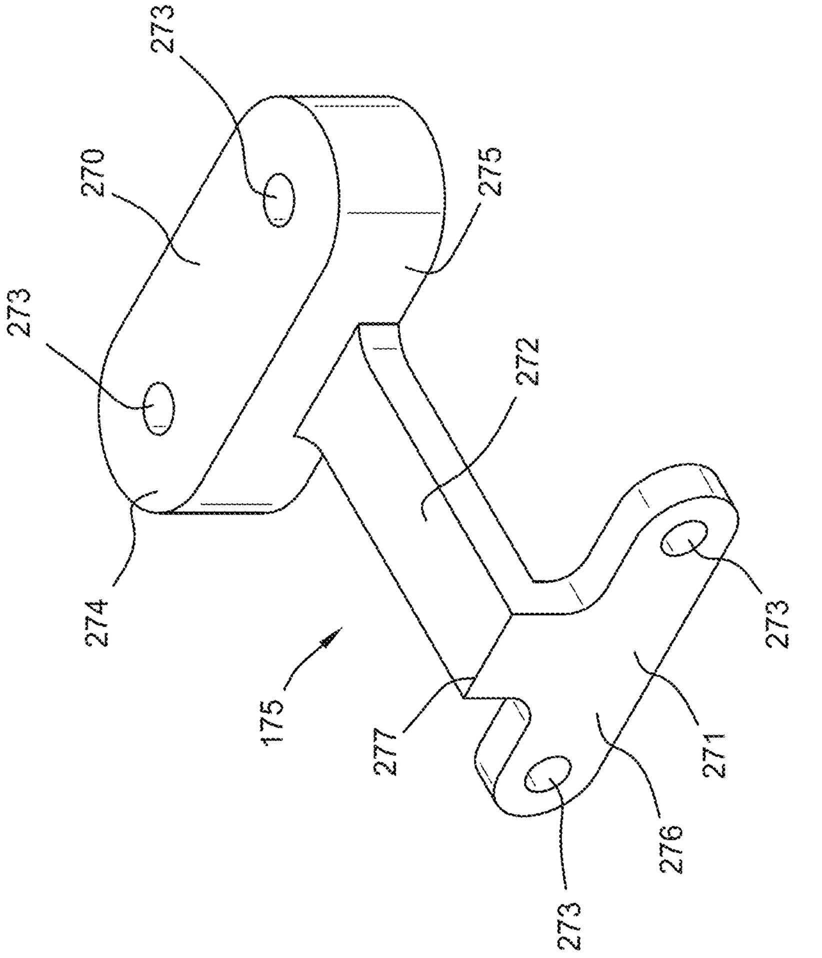
FIG. 2C is a schematic partial perspective view of the mount arm, according to one or more embodiments.

FIG. 2C is a schematic partial perspective view of the mount arm 175, according to one or more embodiments. The mount arm 175 includes an first flange 270, a plasma generator mount 271, a connecting portion 272, and a plurality of holes 273. The first flange 270 is on a first side of the mount arm 175. The first flange 270 at least includes a mount face 274, a sidewall 275, and at least one hole 273. The mount face 274 is configured to be coupled to the inject body 220 of the injector 180. At least one hole 273 extends from the mount face 274 through the first flange 270. In one or more embodiments, at least one fastener (such as bolt, pin, and/or screw) extends through the at least one hole 273 and couples to the inject body 220. The plasma generator mount 271 is on a second side of the mount arm 175. The plasma generator mount includes a mount face 276, a connecting section 277, and at least one hole 273. The mount face 276 is configured to be coupled to the second housing 245 of the plasma generator 170. At least one hole 273 extends from the mount face 276 through the plasma generator mount 271. In one or more embodiments, at least one fastener extends through the at least one hole 273 and couples to the second housing 245. The connection portion 272 extends between the sidewall 275 of the first flange 270 and the connecting section 277 of the plasma generator mount 271. In one or more embodiments, the mount arm 175 is formed of a monolithic body. In one or more embodiments, the mount arm 175 is formed of a plurality of bodies coupled together.

Figure 3:
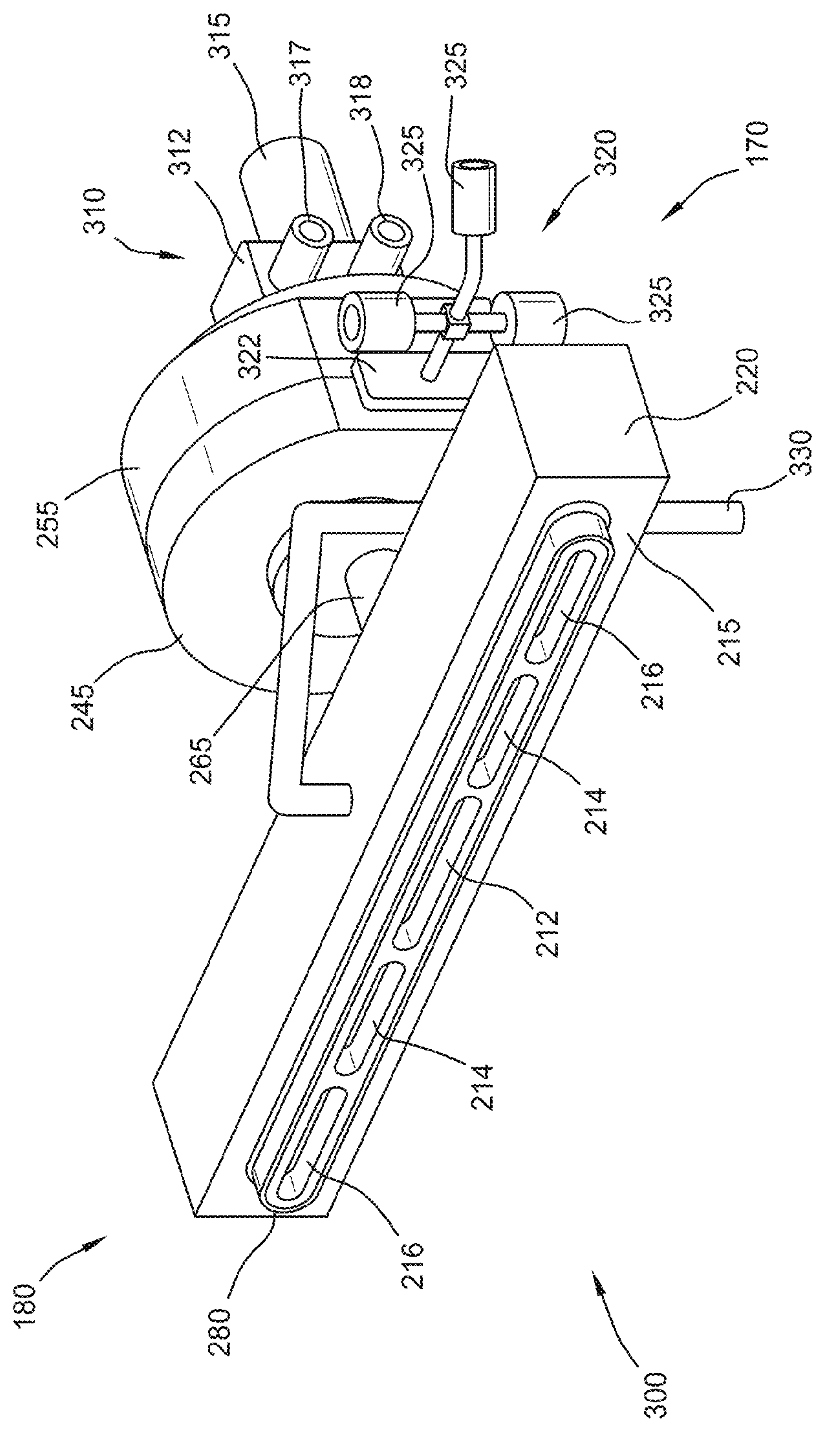
FIG. 3 a schematic isometric view of an injector assembly, according to one or more embodiments.

FIG. 3 is a schematic isometric view of an injector assembly 300, according to one or more embodiments. The injector assembly 300 is similar to injector assembly 200 shown in FIGS. 2A and 2B, and includes one or more aspects, features, components, operations, and/or properties thereof.

The injector assembly 300 includes a power adaptor section 310, a plasma gas inlet section 320, and an injector gas inlet 330. The present disclosure contemplates that one or more additional injector gas inlets can be connected to the inject body 220. The power adaptor section 310 includes a power adaptor block 312, a cable inlet 315, a coolant inlet 317 and a coolant outlet 318. The cable inlet is configured to receive the cable 251. The coolant inlet 317 is configured to be fluidly coupled to a coolant fluid source. The coolant fluid source flow as a coolant fluid into the coolant inlet 317. The coolant inlet is fluidly coupled to cooling channels formed within the plasma generator 170. The coolant fluid absorbs heat produced during the ignition process. The coolant fluid exits the plasma generator 170 through the coolant outlet 318. In one or more embodiments, the coolant fluid includes water. The coolant inlet 317, the coolant outlet 318, and the cable inlet 315 are all mounted on the power adaptor block 312. The adaptor block is coupled to the first housing 255.

The plasma gas inlet section 320 includes gas adaptor block 322 and one or more gas inlet adaptors 325. Although FIG. 3 shows the plasma gas inlet section 320 including three gas inlet adaptors 325, it is contemplated that plasma gas inlet section 320 can include any number of gas inlet adaptors 325. The gas inlet adaptors 325 are configured to be fluidly coupled to one or more gas sources. For example, in FIG. 3, the injector assembly 300 is configured to be coupled to a process gas source 151, a cleaning gas source 153, and a plasma gas source 158. Each gas source is configured to be coupled to a separate gas inlet adaptor 325. The gas inlet adaptors 325 are mounted to the gas adaptor block 322 which is mounted to the second housing 245. The gas inlet adaptors 325 are fluidly coupled to the gas inlet 241. It is contemplated that flow from the process gas source 151, the cleaning gas source 153 and the plasma gas source 158 can all be controlled independently from one another. In one or more embodiments, one or more interlocks are disposed along the flow path for the process gas source 151, the cleaning gas source 153 and the plasma gas source 158 so that the gas flow from each gas source can be turned on and off for different applications. For example, during an ignition process, the process gas source 151 may flow a process gas P1 through the gas inlet adaptor 325 and into the gas inlet 241. Simultaneously the plasma gas source 158 may flow a plasma gas P3 through a different gas inlet adaptor 325 and into the gas inlet 241. The cleaning gas source 153 is prevented from flowing a cleaning gas during the ignition process using an interlock along the cleaning gas flow path. During a cleaning process the gas flow from the process gas source 151 and the plasma gas source 158 can be turned off, and the gas flow from the cleaning gas source 153 is turned on to allow for a cleaning gas to flow through a different gas inlet adaptor 325 into the gas inlet 241. The present disclosure contemplates that the plasma gas can flow during the flow of the cleaning gas to assist the cleaning process. In one or more embodiments, the interlocks are configured to turn off the flow of a nitrogen gas.

The injector gas inlet 330 is fluidly coupled to the injector channel 210. The one or more process gas sources 151, the one or more cleaning gas sources 153, the one or more plasma gas sources 158, and the one or more purge gas sources 162 may each be fluidly coupled to the injector gas inlet 330 in order to flow one or more gases into the injector 180. The one or more process gas sources 151, the one or more cleaning gas sources 153, the one or more plasma gas sources 158, and the one or more purge gas sources 162 may each include a series of interlocks along respective flow paths into the injector gas inlet 330 in order to separately control the flow from each gas source. Although FIG. 3 shows the injector 180 including one injector gas inlet, it is contemplated that the injector 180 can include any number of injector gas inlets 330.

Figure 4A:
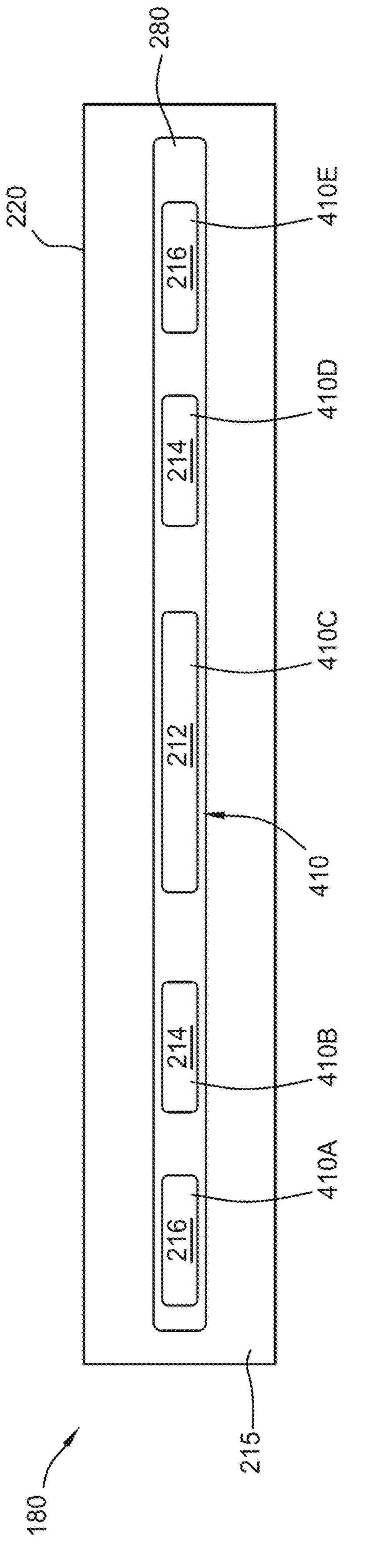
FIGS. 4A and 4B are schematic front views of an injector, according to one or more embodiments.
Figure 4B:
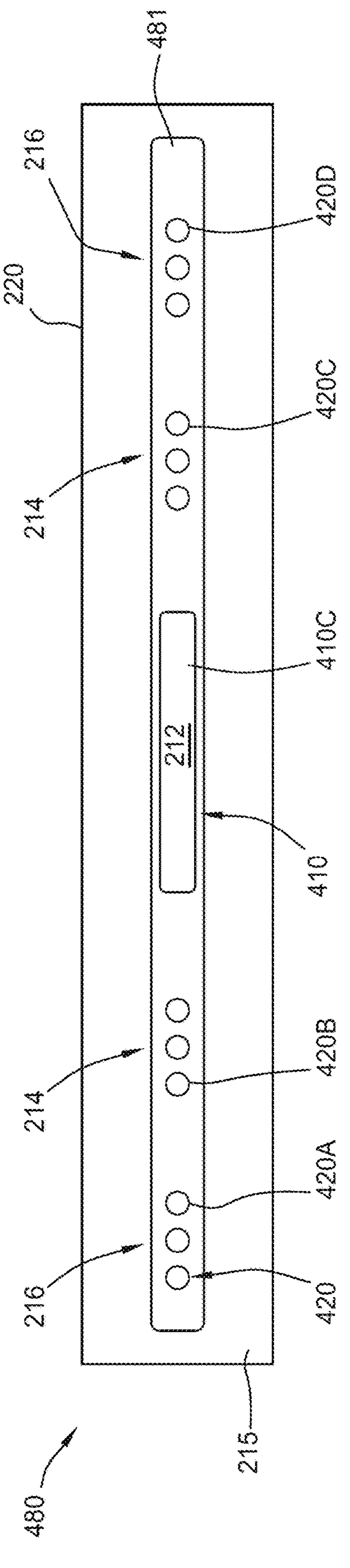

FIGS. 4A and 4B are schematic front views of an injector, according to one or more embodiments. In FIG. 4A, the injector 180 includes the baffle 280 according to one or more embodiments. The baffle 280 includes a plurality of slots 410. Each slot 410 is an opening formed in the baffle 280. Each slot 410 is positioned to open into a respective channel 212, 214, 216. For example, in FIG. 4A, the baffle 280 includes five slots 410. The middle channel 212 has an opening that extends into a third slot 410C. The two inner channels 214 have openings that extend into a second slot 410B and a fourth slot 410D. The two outer channels 216 have openings that extend into a first slot 410A and a fifth slot 410E. The slots 410 help control the desired gas flow into the processing chamber 100. It is contemplated that the baffle 280 can be exchanged with a different baffle which blocks certain channels. For example, a user may replace the baffle 280 with a second baffle that only contains the first slot 410A, the second slot 410B, and the third slot 410C. The second baffle prevents gas from flowing out of one of the inner channels 214 and one of the outer channels 216 by not including a fourth slot 410D and a fifth slot 410E. The second baffle results in a different gas flow path within the processing chamber 100 from the baffle 280. The baffle 280 is disposed in an opening formed in the front surface 215 of the injector 180.

In FIG. 4B, an injector 180 includes a baffle 481 according to one or more embodiments. The baffle 481 is similar to the baffle 280 shown in FIG. 4A, and includes one or more aspects, features, components, operations, and/or properties thereof. The baffle 280 shown in FIG. 4A is replaced with the baffle 480. The baffle 481 includes a slot 410 as well as one or more pluralities of holes 420. The baffle 481 shows each plurality of holes 420 including 3 holes. It should be understood that each plurality of holes 420 can include any number of holes. In FIG. 4B, the baffle 481 includes four sets of holes 420. In FIG. 4B, the middle channel 212 has an opening that extends into a third slot 410C. The two inner channels 214 each have openings that extend into a second set of holes 420B and a third set of holes 420C respectively. The two outer channels 216 have openings that extend into a first plurality of holes 420A and a fourth plurality of holes 420D. It should be understood the baffle 280 and the baffle 481 are shown for exemplary purposes. Other baffles may be used for the injector. For example, a baffle can have five sets of holes 420 and no slots, or may have a single slot 410 or a single set of holes 420 to allow for a single channel of gas flow.

Figure 5:
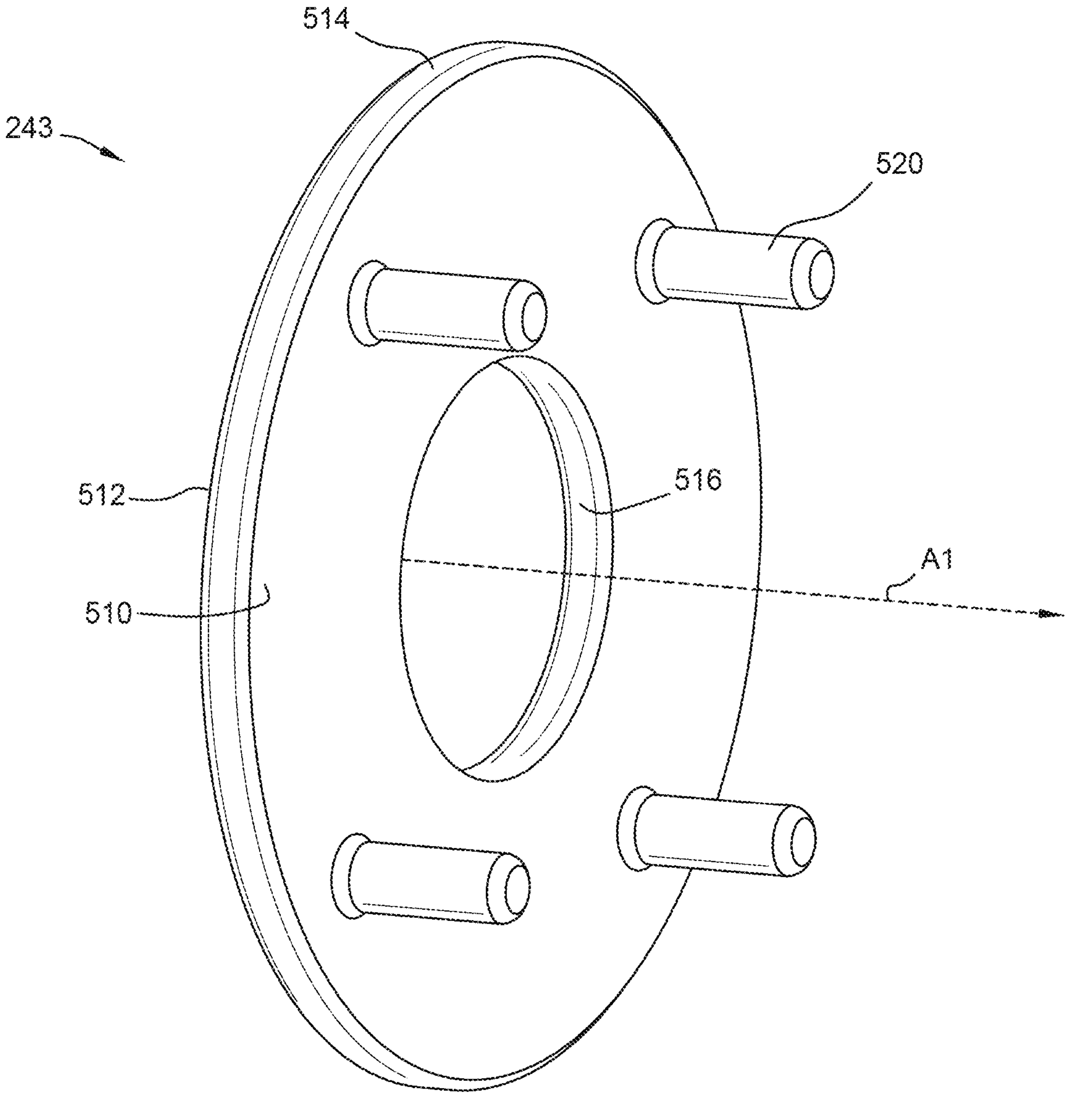
FIG. 5 is a schematic isometric view of the plasma liner, according to one or more embodiments.

FIG. 5 is a schematic isometric view of the plasma liner 243, according to one or more embodiments. The plasma liner 243 includes a first face 510, a second face 512 opposite the first face 510, an outer edge 514, an inner edge 516, and a plurality of legs 520 extending from the first face 510. The plasma liner 243 has a ring shape defined by an inner diameter and an outer diameter. The inner diameter and the outer diameter are concentric to the center axis A1. The outer edge 514 extends along the outer diameter of the plasma liner 243. The inner edge 516 extends along the inner diameter of the plasma liner 243. The plurality of legs 520 extend from the first face parallel to the center axis A1. The plasma liner 243 is configured to be positioned in the plasma volume 240 in the plasma generator 170. The first face 510 is configured to face the isolation plate 256. The second face 512 and the outer edge 514 are configured to contact the second housing 245. The plurality of legs 520 are configured to contact the isolation plate 256 in order to space the plasma liner 243 from the isolation plate 256 and keep the plasma liner 243 stable during an ignition process. The inner edge 516 is aligned with the plasma channel 260. During an ignition process the plasma PS1 flows through the opening defined by the inner edge 516 of the plasma liner 243 into the plasma channel. In one or more embodiments, the plasma liner 243 is formed of a dielectric material. In one or more embodiments, the dielectric material includes quartz.

Figure 6:
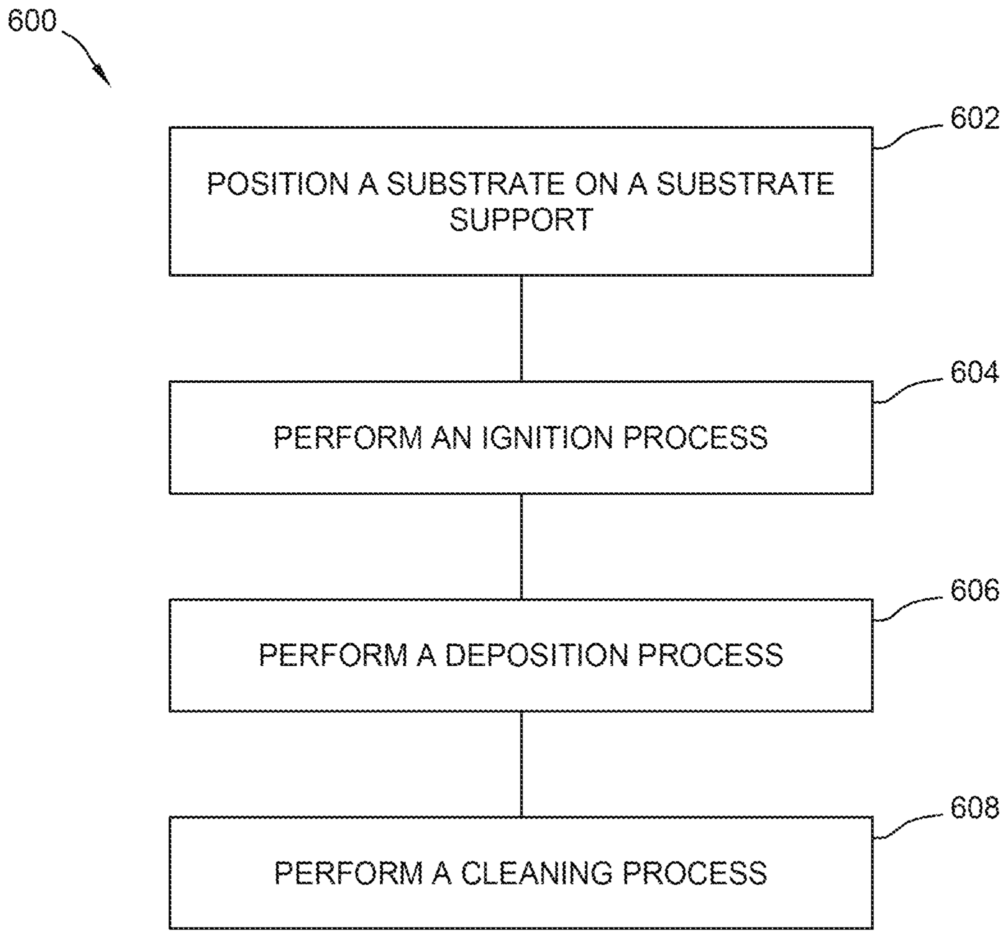
FIG. 6 is a schematic block diagram view of a method of substrate processing for semiconductor manufacturing, according to one or more embodiments.

FIG. 6 is a schematic block diagram view of a method 600 of substrate processing for semiconductor manufacturing, according to one or more embodiments.

Operation 602 includes positioning a substrate on a substrate support in an internal volume of a processing chamber. In one or more embodiments, the positioning includes moving a substrate support and/or a plurality of lift pins relative to each other to land the substrate on the substrate support.

Operation 604 includes performing an ignition process. In one or more embodiments, operation 604 is performed using the processing chamber 100 shown in FIG. 1. During the ignition process a plasma gas P3 is flowed from a plasma gas source 158 into a plasma volume 240 of a plasma generator 170. While the plasma gas P3 is flowed into the plasma volume 240, a plasma power source 199 generates an electromagnetic radiation. The electromagnetic radiation is conducted into the plasma generator 170. The electromagnetic radiation creates an electromagnetic field which ignites the plasma gas P3 into a plasma PS1. The plasma PS1 then flows from the plasma generator 170 and into the injector 180. In one or more embodiments, a process gas P1 is flowed into the plasma generator 170 with the plasma gas P3 during the ignition process. In one or more embodiments, a cleaning gas is flowed into the plasma generator 170 with the plasma gas P3 during the ignition process.

Operation 606 includes performing a deposition process. In one or more embodiments, operation 606 is performed using the processing chamber 100 shown in FIG. 1. During the deposition process a process gas P1 is flowed into the injector 180. The process gas P1 flows into one or more channels 212, 214, 216 within the injector 180. The process gas P1 then flows from the injector 180 into the processing volume 136 through the one or more gas inlets 114. The process gas P1 flows across the top surface 150 of a substrate 102. The process gas P1 deposits a deposition material on the substrate 102 as it flows across the top surface 150. The process gas then exits the process volume through the gas exhaust outlets 116.

In one or more embodiments, operations 604 and 606 are performed simultaneously in a plasma assisted deposition process. During the plasma assisted deposition process the plasma gas P3 produced in operation 604 is flowed into one or more channels 212, 214, 216 within the injector 180. The plasma gas P3 mixes with the process gas P1 in the one or more channels 212, 214, 216. The plasma gas P3 can assist in activating the process gas P1 through collisions. This allows for the deposition material to be deposited on the substrate 102 while keeping the substrate 102 at a relatively low temperature such as a temperature under 500 degrees Celsius (for example 400 degrees Celsius or less). Once the one or more process gases P1 are activated, the one or more process gases P1 flow into the one or more gas inlets 114 and flow further into the processing volume 136. The one or more process gases P1 flow across the top surface 150 of the substrate 102 and deposits the deposition material on the substrate 102. After both the plasma gas P3 and the process gas P1 flow across the substrate, both the plasma gas P3 and the process gas P1 are exhausted through the gas exhaust outlets 116.

Operation 608 includes performing a cleaning process. In one or more embodiments, operation 608 is performed using the processing chamber 100 shown in FIG. 1. During a cleaning process a cleaning gas is flowed into one or more channels 212, 214, 216 within the injector. The cleaning gas includes one or more etchant gases. The cleaning gas removes build up and debris within the injector 180. The cleaning gas then flows from the injector 180 into the processing volume 136 through the gas inlet 114. The cleaning gas then exits the process volume 136 through the gas exhaust outlets 116. In one or more embodiments, the cleaning gas is flowed into the plasma generator 170 during the cleaning operation.

In one or more embodiments, operations 604 and 608 are performed simultaneously in a plasma assisted cleaning process. During the plasma assisted cleaning process the activated plasma gas P3 produced in operation 604 is flowed into one or more channels 212, 214, 216 within the injector 180. The plasma gas P3 mixes with the cleaning gas in the one or more channels 212, 214, 216, and assists the cleaning gas in removing the debris and build up within the injector 180 and/or within the processing chamber 100. The plasma gas P3 and the cleaning gas then flow from the injector 180 into the processing volume 136 through the gas inlet 114. The plasma gas P3 and the cleaning gas then exit the process volume 136 through the gas exhaust outlets 116. In one or more embodiments, the cleaning gas is flowed into the plasma generator 170 during the plasma assisted cleaning operation.

Benefits of the present disclosure include enhanced processing (such as deposition, etching, and/or cleaning), low temperature processing (such as low temperature epitaxial deposition), and low pressure processing. The plasma assisted deposition process described allows for a deposition process to be performed at a temperature under 500 degrees Celsius (such as 400 degrees Celsius or less). This lower temperature allows for the formation of improved semiconductor substrates. The benefits further include improved gas flow control, decreased maintenance, decreased cost, and increased component lifetime.

It is contemplated that one or more aspects disclosed herein may be combined. As an example, one or more aspects, features, components, operations and/or properties of the processing chamber 100; the plasma generator 170; the injector 180; the plasma power source 199; the injector assembly 200; the first housing 255; the resonant volume 253; the cable 251; the monopole 257; the isolation plate 256; the second housing 245; the plasma liner 243; the inject body 220; the middle channel 212; the plurality of inner channels 214; the plurality of outer channels 216; the baffle 280; the injector assembly 300; the power adaptor section 310; the plasma gas inlet section 320; the injector gas inlet 330; the baffle 481; and/or the method 600 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A substrate processing chamber, comprising:
a chamber body at least partially defining an internal volume;
a plasma generator comprising:
a first housing to deliver a generation power;
a second housing coupled to the first housing to at least partially define a plasma volume between the second housing and the first housing; and
a gas inlet extending through the second housing to the plasma volume, the gas inlet configured to be fluidly coupled to a gas source;
an injector fluidly connected to the plasma generator, the injector comprising one or more openings arranged in one or more channels, wherein the one or more openings arranged in one or more channels comprises:
a middle channel fluidly coupled to the plasma volume;
a plurality of inner channels disposed outwardly of the middle channel; and
a plurality of outer channels disposed outwardly of the inner channel, wherein the middle channel, the plurality of inner channels, and the plurality of outer channels are in fluid communication with one another; and
a mount arm comprising a first end section coupled to the injector and a second end section coupled to the second housing.

2. The processing chamber of claim 1, further comprising: one or more of:
an upper window disposed above a substrate support, or
a lower window disposed below the substrate support; and
a plurality of heat sources positioned to heat a substrate disposed on the substrate support through at least one of the upper window or the lower window.

3. The processing chamber of claim 1, further comprising:
an isolation plate disposed between the second housing and the first housing;
a monopole extending through the first housing;
a plasma tube disposed between the plasma generator and the injector; and
a plasma channel fluidly coupled to the plasma volume and the middle channel.

4. The processing chamber of claim 3, further comprising:
a power source coupled to the monopole, wherein the power source is an electromagnetic power source.

5. The processing chamber of claim 1, wherein the gas inlet is configured to flow a deposition gas across a top surface of a substrate disposed on a substrate support.

6. The processing chamber of claim 1, wherein the plasma volume further comprises a plasma liner, wherein the plasma liner is formed of a material comprising quartz.

7. The processing chamber of claim 6, wherein the plasma liner further comprises a first face having a central opening and a plurality of legs extending from the first face.

8. The processing chamber of claim 1, further comprising a baffle disposed an opening formed in a front surface of the injector, wherein the baffle is removable.

9. An injector assembly comprising:
a plasma generator comprising:
a first housing to deliver a generation power;
a second housing coupled to the first housing to at least partially define a plasma volume between the second housing and the first housing; and
a gas inlet extending through the second housing to the plasma volume, the gas inlet configured to be fluidly coupled to a gas source;
a mount arm comprising a first end section to couple to the second housing and a second end section to couple to an injector; and
an injector fluidly connected to the plasma generator, the injector comprising an inject body having one or more openings arranged in one or more channels, the one or more openings comprising:
a middle channel fluidly coupled to the plasma volume;
a plurality of inner channels disposed outwardly of the middle channel; and
a plurality of outer channels disposed outwardly of the inner channel, wherein the middle channel, the plurality of inner channels, and the plurality of outer channels are in fluid communication with one another.

10. The injector assembly of claim 9, further comprising:
an isolation plate disposed between the second housing and the first housing,
a monopole extending through the first housing;
a plasma tube disposed between the plasma generator and the injector; and
a plasma channel fluidly coupled to the plasma volume and the middle channel.

11. The injector assembly of claim 10, further comprising:
a power source coupled to the monopole, wherein the power source is an electromagnetic power source.

12. The injector assembly of claim 9, wherein the plasma volume further comprises a plasma liner, wherein the plasma liner is formed of a material comprising quartz.

13. The injector assembly of claim 12, wherein the plasma liner is a removable component having a ring shape.

14. The injector assembly of claim 12, wherein the plasma liner is a coating applied to one or more surfaces of the second housing exposed to the plasma volume.

15. The injector assembly of claim 9, further comprising a baffle disposed in an opening formed in a front surface of the injector, wherein the baffle is removable.

16. The injector assembly of claim 9, further comprising:
a plurality of gas sources fluidly coupled to the one or more channels; and
one or more interlocks configured to control a gas flow path from the plurality of gas sources to the one or more channels.

17. A method of substrate processing, comprising:
performing an ignition process comprising:
flowing a plasma gas into a plasma volume of a plasma generator, the plasma generator comprising a first housing to deliver a generation power, a second housing coupled to the first housing to at least partially define a plasma volume between the second housing and the first housing, a gas inlet extending through the second housing to the plasma volume, the gas inlet configured to be fluidly coupled to a gas source, a mount arm comprising a first end section to couple to the second housing and a second end section to couple to an injector;

igniting the plasma gas into a plasma using electromagnetic radiation; and performing a chamber substrate process comprising:

activating a processing gas using the plasma;

flowing the processing gas into an the injector, the injector comprising an injector fluidly connected to the plasma generator, the injector comprising an inject body having one or more openings arranged in one or more channels, the one or more openings comprising a middle channel fluidly coupled to the plasma volume, a plurality of inner channels disposed outwardly of the middle channel, and a plurality of outer channels disposed outwardly of the inner channel, wherein the middle channel, the plurality of inner channels, and the plurality of outer channels are in fluid communication with one another;

flowing the processing gas from the injector across the substrate in an internal volume; and processing the substrate using the processing gas.

18. The method of claim 17, wherein the ignition process and the substrate process are performed simultaneously, and the substrate process comprises one or more of deposition on the substrate or etching of the substrate.

* * * * *